US009583345B2

(12) United States Patent
Chen et al.

(10) Patent No.: US 9,583,345 B2
(45) Date of Patent: Feb. 28, 2017

(54) METHOD FOR OVERCOMING BROKEN LINE AND PHOTORESIST SCUM ISSUES IN TRI-LAYER PHOTORESIST PATTERNING

(71) Applicant: Taiwan Semiconductor Manufacturing Company, Ltd., Hsin-Chu (TW)

(72) Inventors: Wen-Yen Chen, HsinChu County (TW); Kuan-Nan Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/862,410

(22) Filed: Sep. 23, 2015

(65) Prior Publication Data

US 2016/0013059 A1 Jan. 14, 2016

Related U.S. Application Data

(63) Continuation of application No. 14/140,675, filed on Dec. 26, 2013, now Pat. No. 9,159,561.

(51) Int. Cl.
*H01L 21/033* (2006.01)
*H01L 21/027* (2006.01)
*H01L 21/311* (2006.01)

(52) U.S. Cl.
CPC ....... *H01L 21/0337* (2013.01); *H01L 21/0273* (2013.01); *H01L 21/0274* (2013.01); *H01L 21/0332* (2013.01); *H01L 21/31116* (2013.01); *H01L 21/31138* (2013.01)

(58) Field of Classification Search
None
See application file for complete search history.

(56) References Cited

U.S. PATENT DOCUMENTS

| | | | |
|---|---|---|---|
| 4,333,793 A | 6/1982 | Lifshitz et al. |
| 5,895,740 A | 4/1999 | Chien et al. |
| 6,326,307 B1 | 12/2001 | Lindley et al. |
| 6,569,774 B1 | 5/2003 | Trapp |
| 6,617,253 B1 | 9/2003 | Chu et al. |
| 6,833,325 B2 | 12/2004 | Huang et al. |
| 6,900,139 B1 | 5/2005 | Dakshina-Murthy et al. |
| 6,916,746 B1 | 7/2005 | Hudson et al. |
| 7,056,830 B2 | 6/2006 | Merry et al. |
| 7,547,636 B2 | 6/2009 | Chi et al. |

(Continued)

OTHER PUBLICATIONS

Kazuki Narishige, et al., "EUV Resist Curing Technique for LWR Reduction and Etch Selectivity Enhancment" Proc. of SPIE vol. 8328 83280N-1, year 2012, 6 pages.

(Continued)

*Primary Examiner* — Allan Olsen
(74) *Attorney, Agent, or Firm* — Haynes and Boone, LLP

(57) ABSTRACT

A method of fabricating a semiconductor device includes forming a first layer over a substrate and forming a second layer over the first layer. The method further includes patterning the second layer into a mask having one or more openings that expose portions of the first layer. The method further includes etching the first layer through the one or more openings via a first etching process, resulting in a patterned first layer. The first etching process includes forming a coating layer around both the mask and the patterned first layer while the first layer is being etched.

20 Claims, 8 Drawing Sheets

Cross-sectional View

(56) References Cited

U.S. PATENT DOCUMENTS

| | | |
|---|---|---|
| 7,560,360 B2 | 7/2009 | Cheng et al. |
| 7,910,489 B2 | 3/2011 | Kim et al. |
| 8,058,181 B1 | 11/2011 | Chen et al. |
| 8,349,533 B2 | 1/2013 | Ohsawa et al. |
| 2002/0028392 A1 | 3/2002 | Jin et al. |
| 2005/0074695 A1 | 4/2005 | Nakamura et al. |
| 2006/0024973 A1 | 2/2006 | Jost et al. |
| 2006/0259886 A1 | 11/2006 | Sadjadi et al. |
| 2007/0172759 A1 | 7/2007 | Ogihara et al. |
| 2007/0186953 A1* | 8/2007 | Savas ............... G03F 7/427 134/1.3 |
| 2008/0038662 A1 | 2/2008 | Hatakeyama et al. |
| 2008/0194109 A1 | 8/2008 | Ishibashi et al. |
| 2010/0237042 A1 | 9/2010 | Nguyen et al. |
| 2011/0076845 A1 | 3/2011 | Tsai et al. |
| 2012/0067844 A1 | 3/2012 | Kamata et al. |
| 2012/0156593 A1 | 6/2012 | Hsieh et al. |
| 2013/0137041 A1 | 5/2013 | Ogihara et al. |

OTHER PUBLICATIONS

"Dry Etching with Phoresist Mask" revised Nov. 7, 2013, source www.microchemicals com/downloads/application_notes.html, 5 pages.

R. D'Agostino, et al. "Mechanisms of Etching and Polymerization in Radiofrequency Discharge of CF4-H2, CF4-C2F4, C2F6-H2, C3F-H2," Journal of Applied Physics 54, 1284 (1983); doi: 10.1063-1.332193.

Nobuki Mutsukura, et al., Deposition Mechanism of Hydrogenated Hard-Carbon Films in a CH4 rf Discharge Plasma, Journal of Applied Physics 72, 43 (1992); doi: 10.1063/1.352145.

M. Schaepkens, et al., "Effects of Radio Frequency Bias Frequency Bias Pulsing on SiO 2 Feature Etching in Inductively Coupled Fluorocarbon Plasmas," Journal of Vaccum Science & Technology B 18, 856 (2000); doi: 10.116/1.591286.

* cited by examiner

Cross-sectional View

Top View

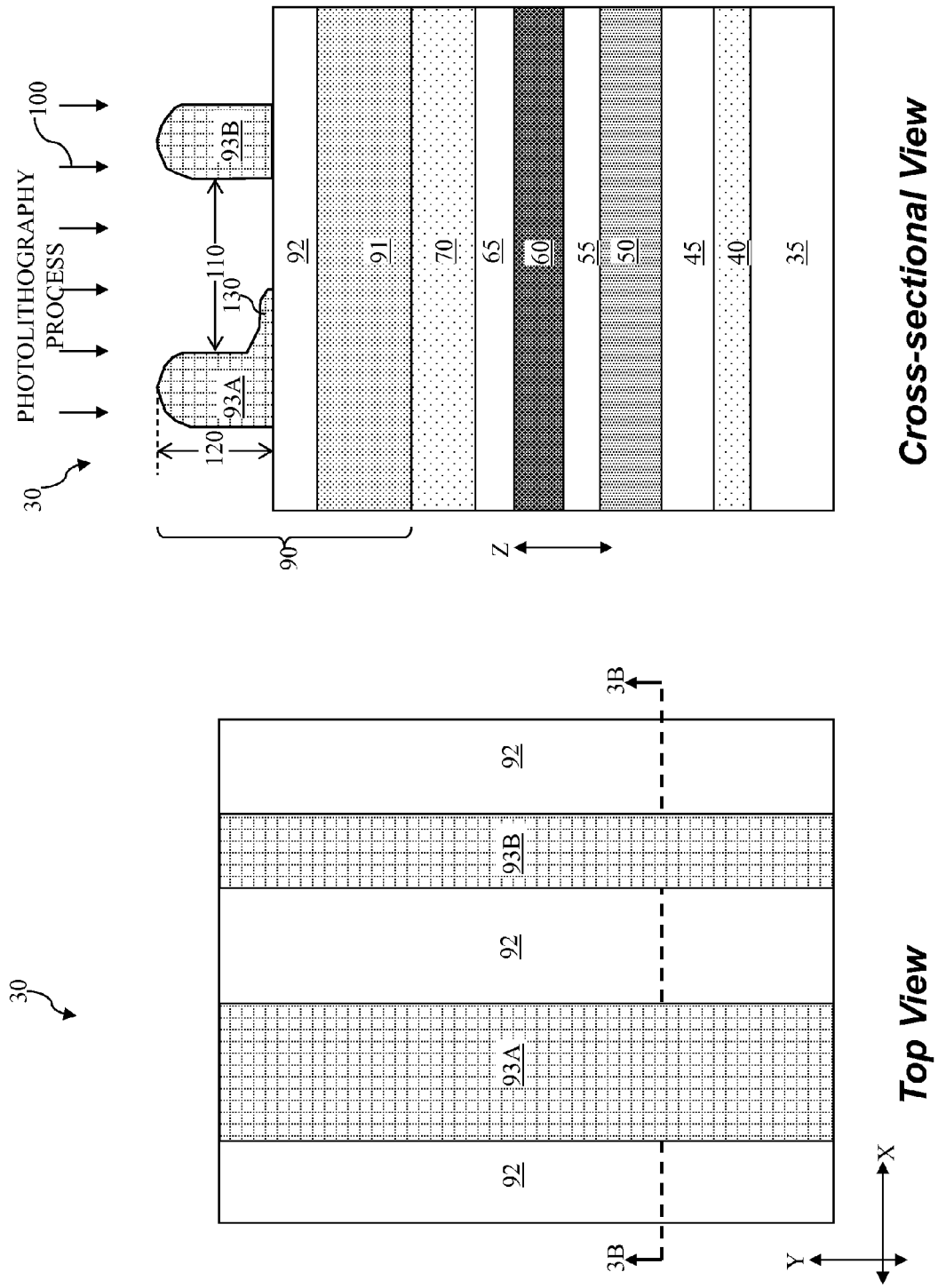

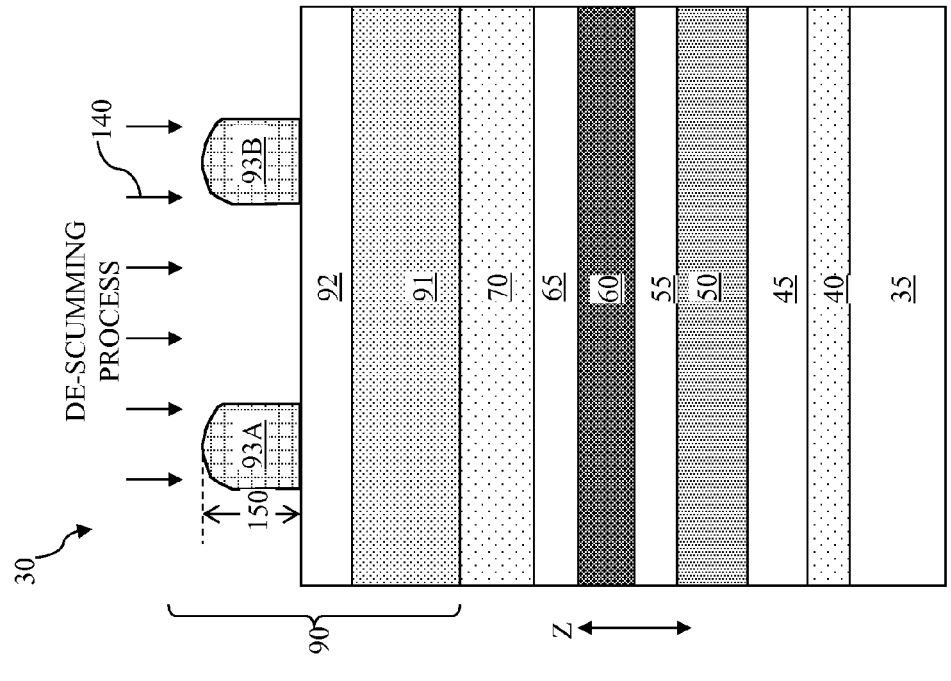
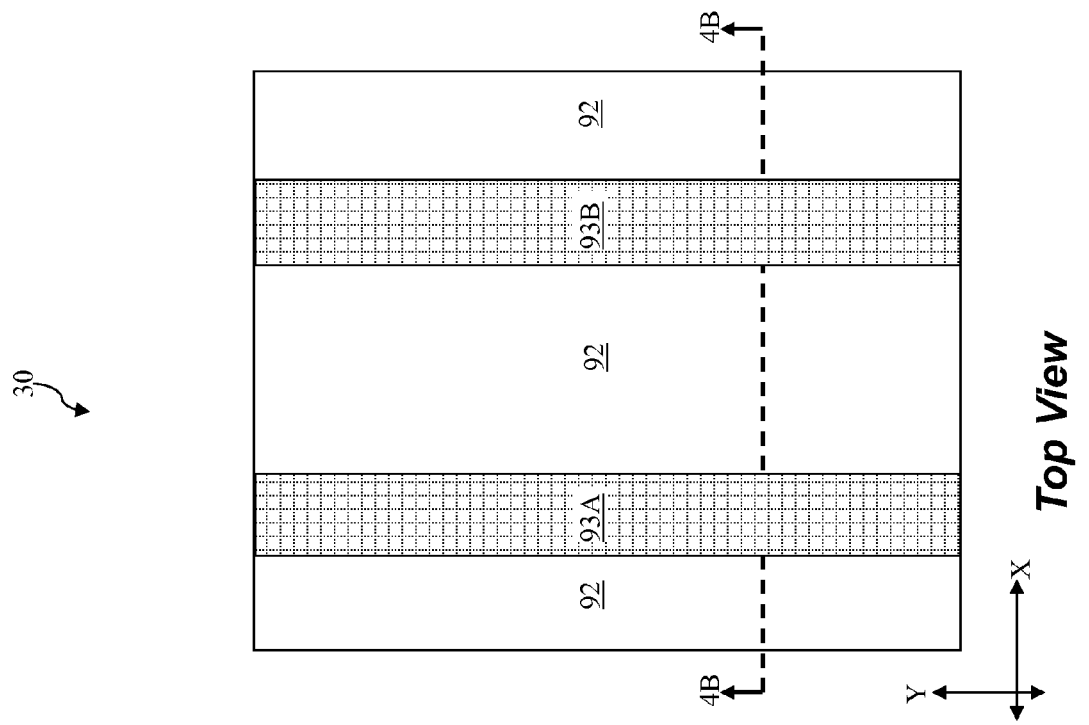
Fig. 4B *Cross-sectional View*
Fig. 4A *Top View*

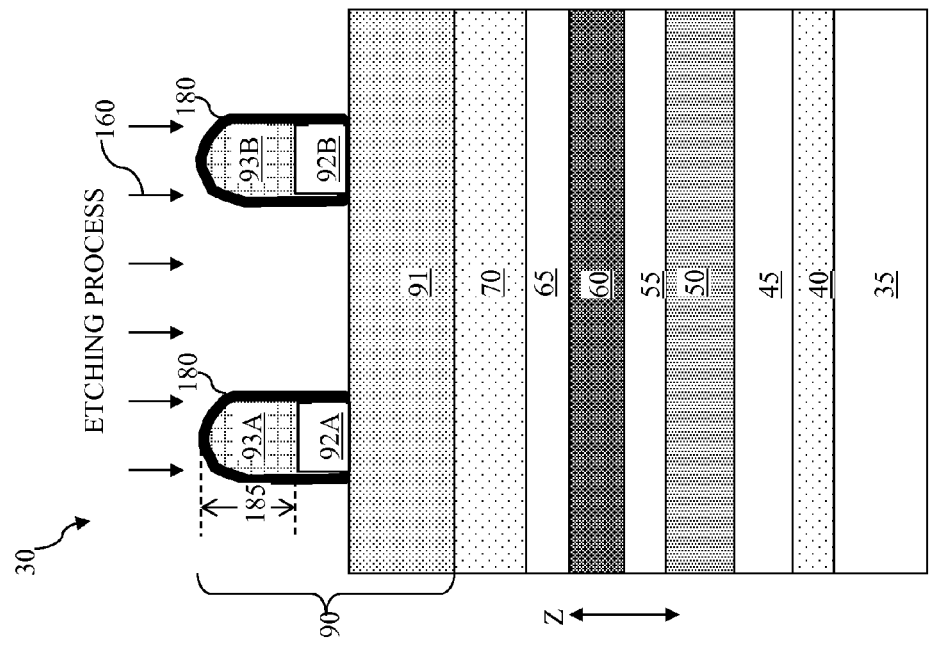
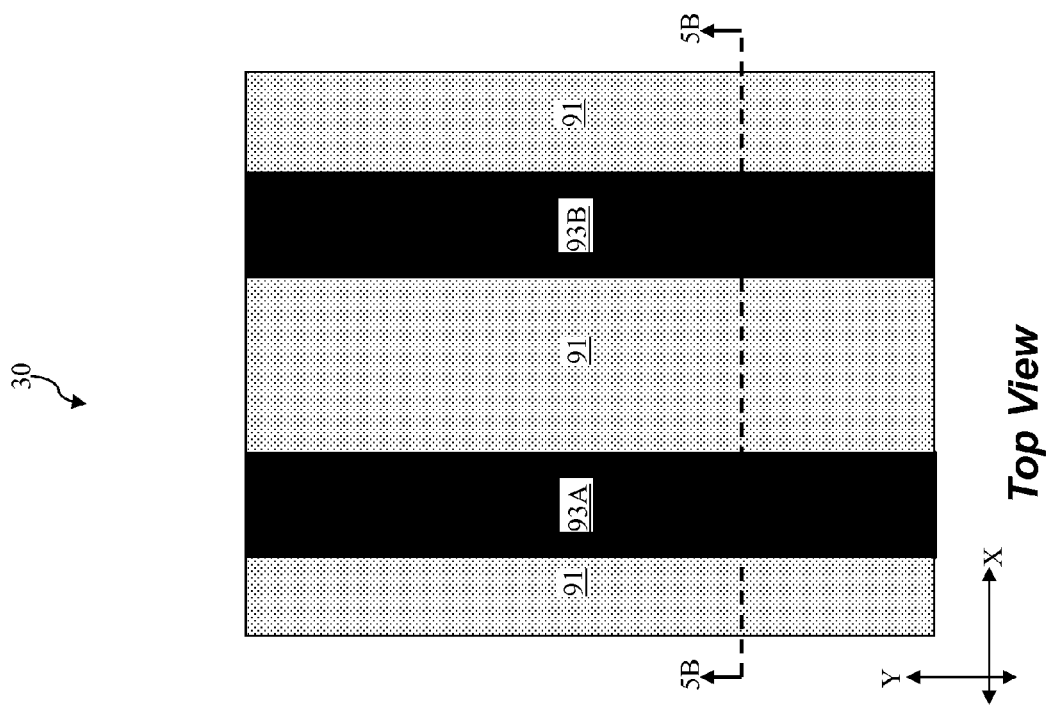
Fig. 5B Cross-sectional View
Fig. 5A Top View

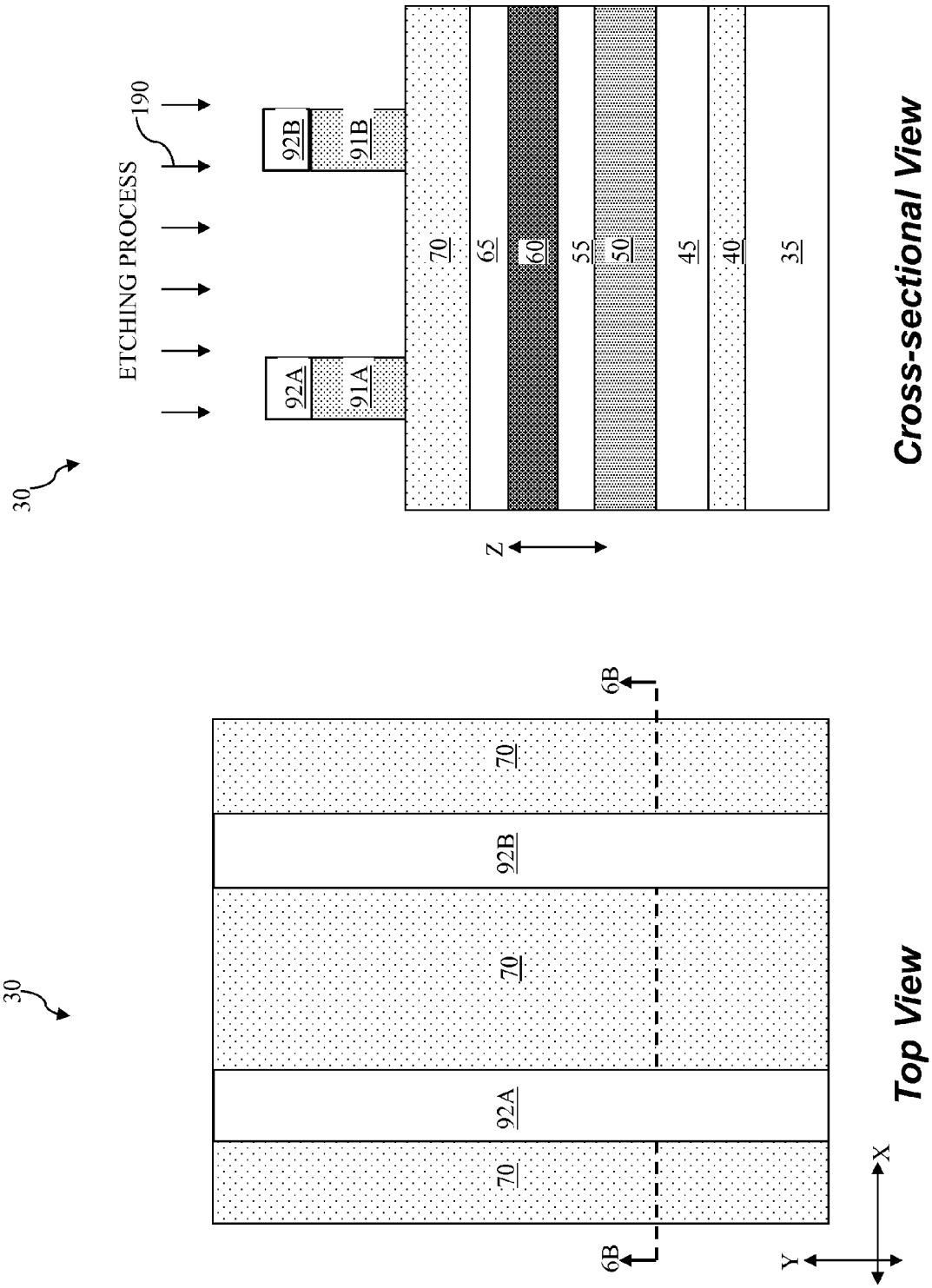

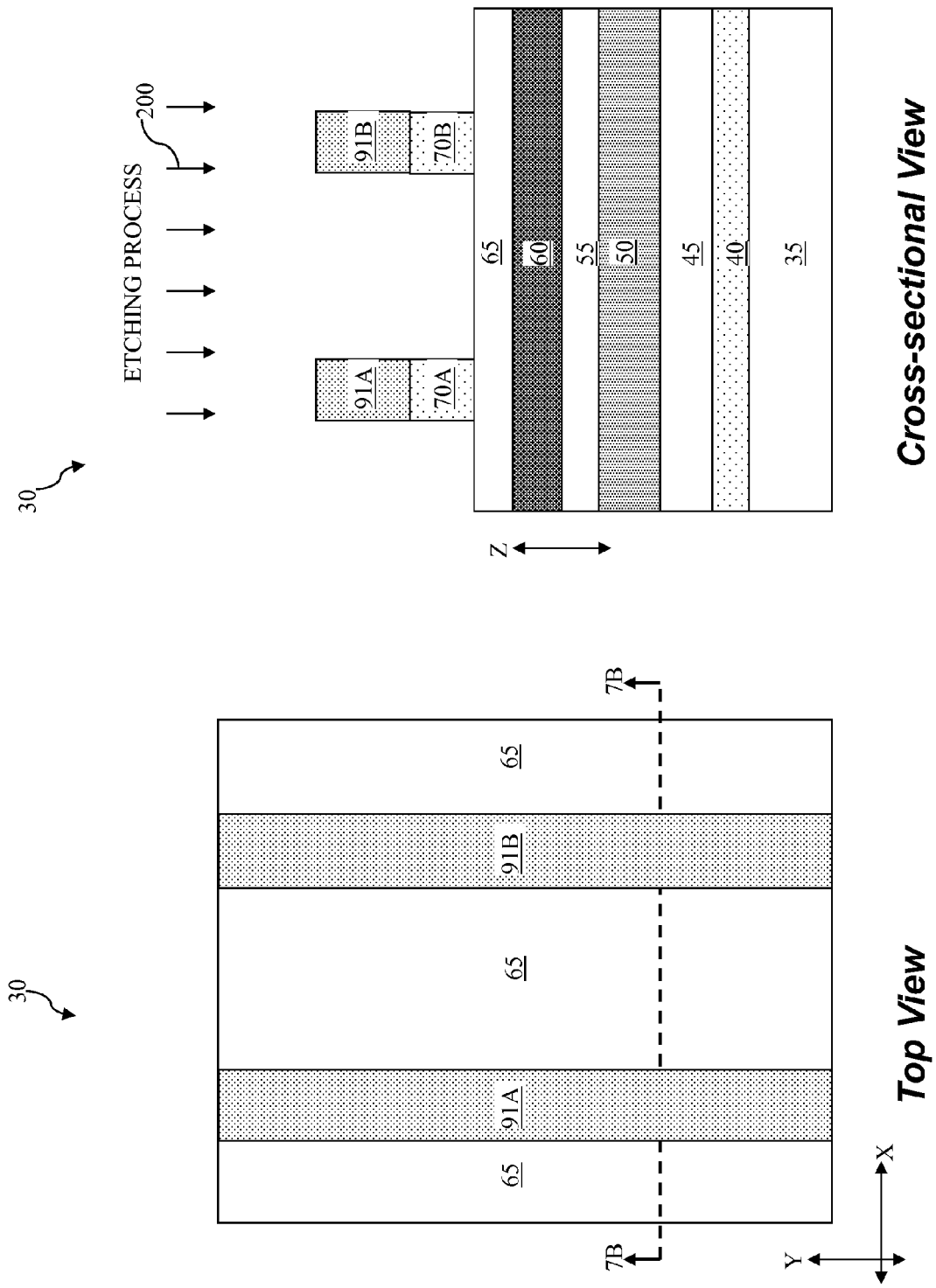

METHOD FOR OVERCOMING BROKEN LINE AND PHOTORESIST SCUM ISSUES IN TRI-LAYER PHOTORESIST PATTERNING

PRIORITY DATA

The is a continuation application of U.S. patent application Ser. No. 14/140,675 entitled "METHOD FOR OVERCOMING BROKEN LINE AND PHOTORESIST SCUM ISSUES IN TRI-LAYER PHOTORESIST PATTERNING," filed Dec. 26, 2013, herein incorporated by reference in its entirety.

TECHNICAL FIELD

The present disclosure relates generally to a method of patterning a semiconductor device, and more particularly, to an improved patterning technique using a tri-layer photoresist.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreasing geometry sizes may lead to various manufacturing difficulties. For example, a tri-layer photoresist is commonly used to pattern layers in semiconductor processes. However, as the device sizes become smaller and smaller, the use of tri-layer photoresist may cause broken line and/or photoresist scum issues, which may degrade semiconductor device performance or even lead to device failures.

Therefore, while existing methods of patterning semiconductor devices have been generally adequate for their intended purposes, they have not been entirely satisfactory in every aspect.

BRIEF DESCRIPTION OF THE DRAWINGS

The present disclosure is understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, and 7A are diagrammatic fragmentary top level views of a portion of a semiconductor device at different stages of fabrication in accordance with aspects of the present disclosure.

FIGS. 2B, 3B, 4B, 5B, 6B, and 7B are diagrammatic fragmentary cross-sectional side views of the portion of the semiconductor device of FIGS. 2A-7A at different stages of fabrication in accordance with aspects of the present disclosure.

DETAILED DESCRIPTION

Figure 1:
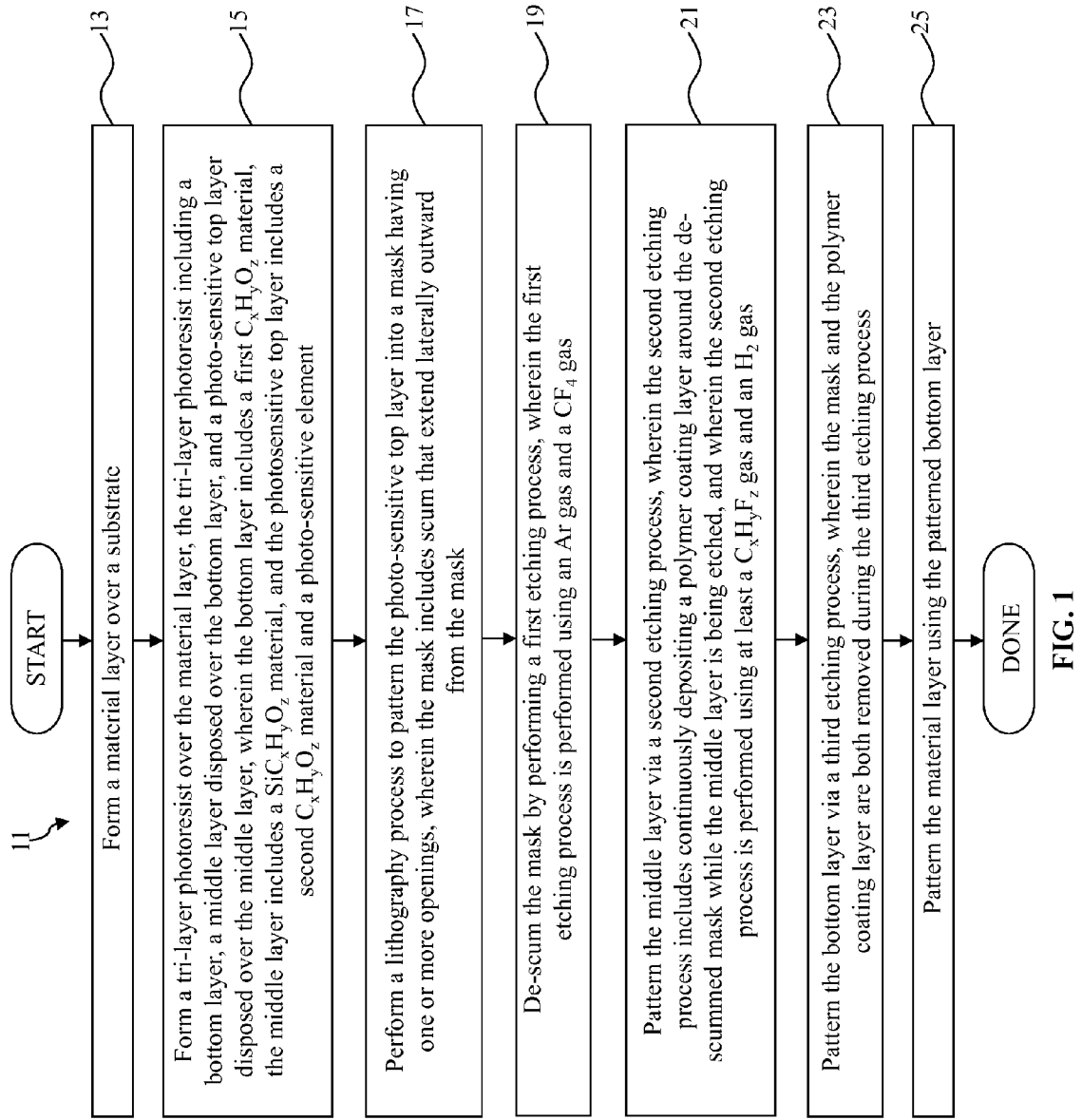
FIG. 1 is a flow chart of a method for patterning a semiconductor device in accordance with aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 11 for patterning a semiconductor device with a tri-layer photoresist. The method 11 includes a step 13, in which a material layer is formed over a substrate. The method 11 includes a step 15, in which a tri-layer photoresist is formed over the material layer. The tri-layer photoresist includes a bottom layer, a middle layer disposed over the bottom layer, and a photo-sensitive top layer disposed over the middle layer. The bottom layer includes a first $C_xH_yO_z$ material, the middle layer includes a $SiC_xH_yO_z$ material, and the photosensitive top layer includes a second $C_xH_yO_z$ material and a photo-sensitive element. The method 11 includes a step 17, in which a lithography process is performed to pattern the photo-sensitive top layer into a mask having one or more openings. The mask includes scum that extends laterally outward from the mask. The method 11 includes a step 19, in which the mask is de-scummed by performing a first etching process. The first etching process is performed using an Ar gas and a $CF_4$ gas. The method 11 includes a step 21, in which the middle layer is patterned via a second etching process. The second etching process includes continuously depositing a polymer coating layer around the de-scummed mask while the middle layer is being etched. The second etching process is performed using at least a $C_xH_yF_z$ gas and an $H_2$ gas. In some embodiments, a flow rate of the $H_2$ gas of the second etching process is in a range from about 50 standard cubic centimeters per minute (sccm) to about 250 sccm. In some embodiments, the second etching process includes an Inductively Coupled Plasma (ICP) process with a bias voltage ranging between about 120 volts and about 240 volts. The method 11 includes a step 23, in which the bottom layer is patterned via a third etching process. The mask and the polymer coating layer are both removed during the third etching process. The method 11 includes a step 25, in which the material layer is patterned using the patterned bottom layer.

FIGS. 2A-7A are diagrammatic fragmentary top level views of a portion of a semiconductor device 30 during various patterning stages in accordance with an embodiment of the method 11 described in FIG. 1. FIGS. 2A-7A are two-dimensional views, wherein the two dimensions respectively extend along an X axis and a Y axis perpendicular to the X axis. FIGS. 2B-7B are diagrammatic fragmentary cross-sectional side views of the portion of the semiconductor device 30 observed in a direction that is along the Y axis. Alternatively stated, the cross-section is cut in the direction along the X axis. The various forming and etching processes (discussed later) performed on the semiconductor device 30 are done along a Z axis that is perpendicular to an imaginary plane formed by the X axis and the Y axis.

The semiconductor device 30 may be a portion of an integrated circuit (IC) chip and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2A-7A and 2B-7B have been simplified for a better understanding of the inventive concepts of the present disclosure. Accordingly, it should be noted that additional processes may be provided before, during, and after the method 11 of FIG. 1, and that some other processes may only be briefly described herein.

Figure 2B:
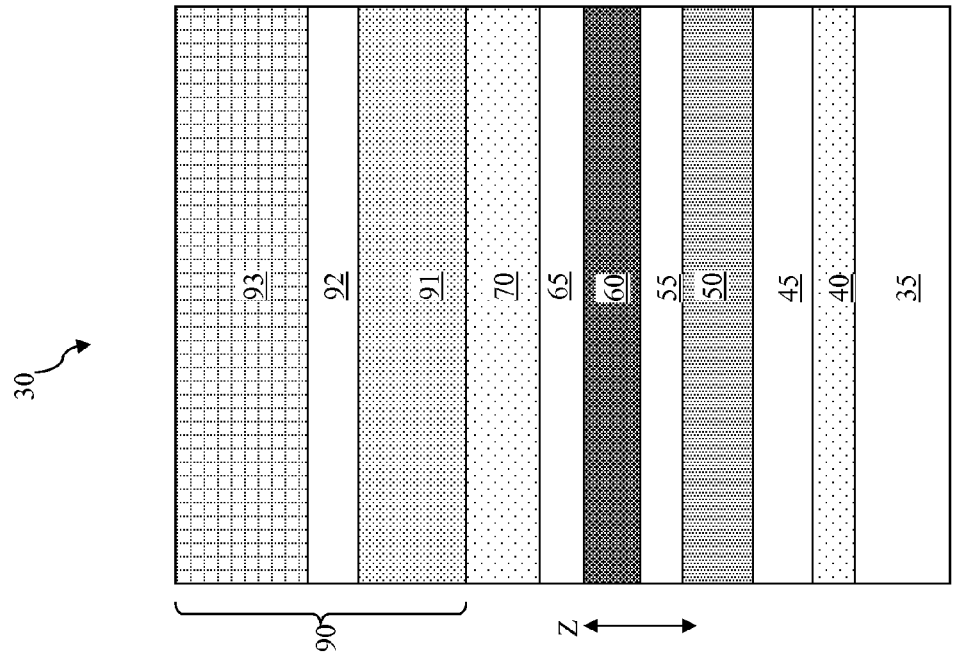
Figure 2A:
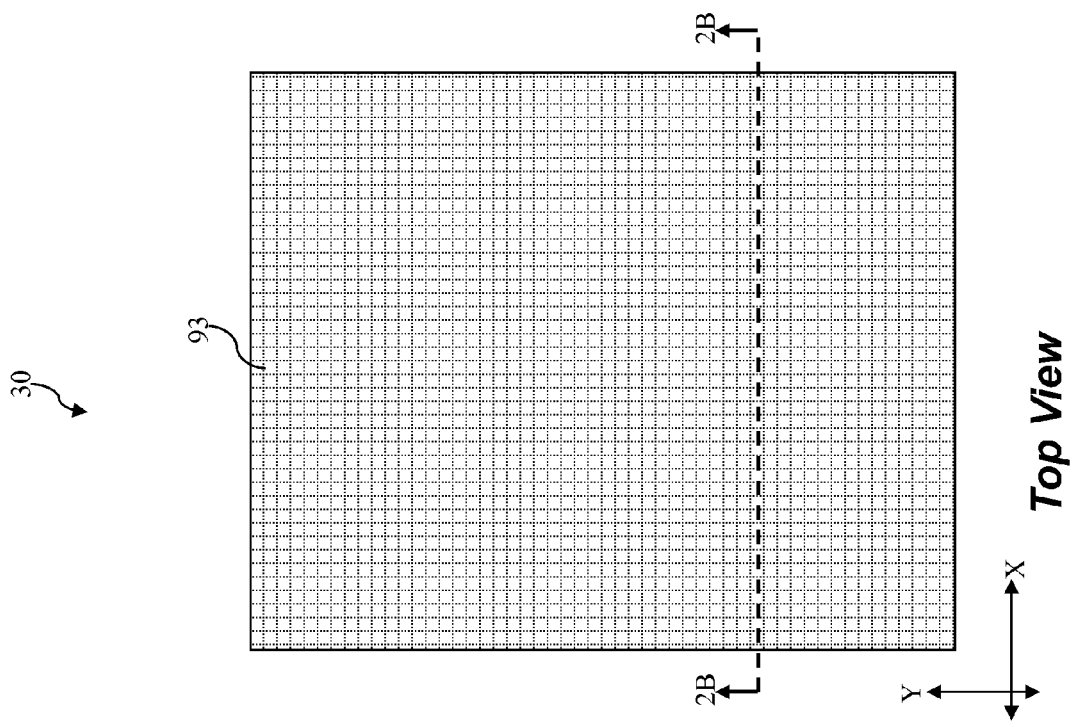

Referring to FIGS. 2A and 2B, the semiconductor device 30 includes a substrate 35. The substrate 35 may be a semiconductor wafer, or may be an under-layer such as a metal layer ($M_x$ to $M_{x+1}$). For example, the substrate 35 may include silicon. The substrate 35 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 35 may include a non-semiconductor material such as a glass substrate for thin-film-transistor liquid crystal display (TFT-LCD) devices, or fused quartz or calcium fluoride for a photomask (mask). The substrate 35 may include various doped regions and/or dielectric features for various microelectronic components, such as a complementary metal-oxide-semiconductor field-effect transistor (CMOSFET), imaging sensor, memory cell, and/or capacitive element.

A silicide-blocking layer (SBL) 40 is formed over the substrate 35. The silicide-blocking layer 40 may also be referred to as a silicidation-blocking layer. In some embodiments, the silicide-blocking layer 40 is formed by a suitable process such as physical vapor deposition (PVD), sputtering, chemical vapor deposition (CVD), atomic layer deposition (ALD), or combinations thereof. The silicide-blocking layer 40 includes a dielectric material such as silicon oxide or silicon nitride in the present embodiment, but may include another suitable material in alternative embodiments. It is understood that in some embodiments, the silicide-blocking layer 40 may not be formed directly on the upper surface of the substrate 35. Instead, other suitable layers may be formed between the substrate 35 and the silicide-blocking layer 40.

A Tetraethyl orthosilicate (TEOS) layer 45 is formed over the silicide-blocking layer 40. In some embodiments, the TEOS layer 50 is formed by a process such as PVD, CVD, plasma enhanced chemical vapor deposition (PECVD), combinations thereof, or another suitable technique.

A low-k dielectric layer 50 is formed over the TEOS layer 45. In some embodiments, the low-k dielectric layer 50 is formed by a process such as PVD, CVD, PECVD, ALD, combinations thereof, or another suitable technique. The low-k dielectric layer 50 includes a low-k material, which is a material having a dielectric constant less than that of standard silicon dioxide (dielectric constant of silicon oxide is about 3.9). In various embodiments, the low-k dielectric material may include, but is not limited to, fluorine-doped silicon dioxide, carbon-doped silicon dioxide, porous silicon dioxide, porous carbon-doped silicon dioxide, spin-on organic polymeric dielectrics, spin-on silicone based polymeric dielectric, polyimides, aromatic polymers, fluorine-doped amorphous carbon, vapor-deposited parylene, etc.

An anti-reflective coating (ARC) layer 55 is formed over the low-k dielectric layer 50. In some embodiments, the anti-reflective coating 55 is a nitrogen-free anti-reflective coating (NFARC) layer. The anti-reflective coating layer 55 may be formed by a suitable deposition technique known in the art.

A titanium nitride layer 60 is then formed over the ARC layer 55. The titanium nitride layer 60 is formed by a radio-frequency physical vapor deposition (RFPVD) process in the present embodiment, but may be formed by an alternative process in another embodiment.

A Tetraethyl orthosilicate (TEOS) layer 65 is then formed over the titanium nitride layer 60. In some embodiments, the TEOS layer 50 is formed by a process such as PVD, CVD, plasma enhanced chemical vapor deposition (PECVD), combinations thereof, or another suitable technique.

An amorphous silicon layer 70 is then formed over the TEOS layer 65. The amorphous silicon layer 70 is formed by a process such as PVD, CVD, sputtering, or another suitable technique. The amorphous silicon layer 70 herein serves as a mask layer to be patterned by a photoresist layer (discussed below). In other embodiments, a mask layer of another suitable material may be used instead of the amorphous silicon layer 70.

It is understood that the layers 40-70 are merely example layers that can be patterned by a photoresist layer. In other embodiments, a subset of the layers 40-70 or different layers may be formed over the substrate 35 and may be patterned by the photoresist layer discussed below.

A tri-layer photoresist 90 is formed over the hard mask layer 80. In the present embodiment, the tri-layer photoresist 90 includes a bottom layer 91, a middle layer 92, and a top layer 93. In some embodiments, the bottom layer 91 includes a $C_xH_yO_z$ material, the middle layer 92 includes a $SiC_xH_yO_z$ material, and the top layer 93 includes a $C_xH_yO_z$ material. The $C_xH_yO_z$ material of the bottom layer 91 may be identical to the $C_xH_yO_z$ material of the top layer 93 in some embodiments, but they may also be different in other embodiments. The top layer 93 also includes a photo-sensitive element, such as a photo-acid generator (PAG). This allows a photolithography process to be performed to pattern the top layer 93. It is understood that in other embodiments, one or more layers of the tri-layer photoresist may be omitted, or additional layers may be provided as a part of the tri-layer photoresist, and the layers may be formed in difference sequences.

Typically, the top layer 93 is patterned by a photolithography process, which may include one or more exposure, developing, rinsing, and baking processes (not necessarily performed in this order). The photolithography process patterns the top layer 93 into a photoresist mask, which may have one or more trenches or openings that expose the middle layer 92 therebelow. The middle layer 92 is then etched using the photoresist mask to form a patterned middle layer, and the bottom layer 91 is then etched using the patterned middle layer to form a patterned bottom layer. The patterned bottom layer is then used to pattern the various layers below. Unfortunately, conventional techniques of performing these patterning and etching processes tend to cause broken line and/or photoresist scum issues, which may degrade semiconductor device performance or cause semiconductor device failure.

According to the various aspects of the present disclosure, an improved lithography/patterning technique is used to substantially reduce or alleviate the broken line and/or photoresist scum issues associated with conventional techniques. The details of the present disclosure are discussed below.

Referring now to FIGS. 3A-3B, a photolithography process 100 is performed to the top layer 93 to form a patterned photoresist mask. The patterned photoresist mask includes segments 93A and 93B, which are being separated by a gap or an opening 110. In some embodiments, a width (i.e., horizontal dimension) of the gap 110 is in a range from about 20 nanometers (nm) to about 100 nm. The segments 93A and 93B also have a height (i.e., vertical dimension) 120. In some embodiments, the height 120 is in a range from about 400 Angstroms to about 700 Angstroms.

Due to various imperfections of the photolithography process 100, undesirable photoresist scum may be formed. For example, a laterally-protruding portion 130 near the bottom of the segment 93A represents the photoresist scum and may be hereinafter referred to as such. As is illustrated, the photoresist scum 130 effectively reduces the gap 110 between the adjacent segments 93A and 93B and enlarges the size of the segment 93A. As such, the presence of the photoresist scum 130 may lead to inaccuracies or other failures in subsequent patterning processes. Hence, it is desirable to remove the photoresist scum 130.

Referring now to FIGS. 4A-4B, the photoresist scum 130 is removed in a de-scumming process 140. In some embodiments, the de-scumming process 140 includes an etching process. According to the various aspects of the present disclosure, the etching process is performed at an etching chamber using a continuous plasma process, for example an inductively coupled plasma (ICP) process. In certain embodiments, an etching gas of the de-scumming process 140 includes Ar and $CF_4$. The Ar gas and the $CF_4$ gas may each have a flow rate in a range from about 30 standard cubic centimeters per minute (sccm) to about 50 sccm, for example about 40 sccm. In some embodiments, the Ar gas and the $CF_4$ gas have a flow ratio of about 1:1. The etching process is performed at a pressure in a range from about 1 milli-Torr (mT) to about 3 mT, for example about 2 mT. A source power for the ICP process may be in a range from about 200 Watts (W) to about 250 W, for example about 220 W. A bias voltage for the IPC process may be in a range from about 80 Volts (V) to about 150 V, for example about 110 V.

As a result of the de-scumming process 140, the segments 93A and 93B are reduced to a lower height 150, which is less than the height 120 shown in FIG. 3B before the de-scumming process 140 was performed. In some embodiments, the height 150 is in a range from about 300 Angstroms to about 500 Angstroms. The segments 93A and 93B of the patterned top layer may now be used to pattern the middle layer 92 below.

Referring now to FIGS. 5A and 5B, an etching process 160 is performed to "open" the middle layer 92. In other words, the middle layer 92 is patterned into segments 92A and 92B. The segments 93A and 93B serve as a photoresist mask in this etching process 160. The etching process 160 may be performed in the same etching chamber that was used to perform the de-scumming process 140 discussed above. In other words, the etching process 160 also involves a continuous plasma process (a pulsing-free process), for example the ICP process. In certain embodiments, an etching gas of the etching process 160 includes $CF_4$, $CHF_3$, $H_2$, $N_2$, and Ar. The $CHF_3$ gas serves as a main gas in the present embodiment, and the $N_2$ and Ar gases serve as assistant gases in the present embodiment. The $CF_4$ gas may have a flow rate in a range from about 50 sccm to about 70 sccm, for example about 60 sccm, the $CHF_3$ gas may have a flow rate in a range from about 45 sccm to about 65 sccm, for example about 55 sccm, the $H_2$ gas may have a flow rate in a range from about 50 sccm to about 250 sccm, for example about 150 sccm, the $N_2$ gas may have a flow rate in a range from about 50 sccm to about 80 sccm, for example about 65 sccm, and the Ar gas may have a flow rate in a range from about 40 sccm to about 60 sccm, for example about 50 sccm.

It is understood that the flow rate of the $H_2$ gas is optimized in the range from about 50 sccm to about 250 sccm, as a slower flow rate may lead to incomplete or ineffective etching, and a faster flow rate may lead to too much photoresist loss (i.e., the loss of the segments 93A and 93B). This will be discussed in more detail below with reference to FIG. 8. It is also understood that in alternative embodiments, other suitable $C_xH_yF_z$ (where x>0, y>=0, and z>0) gases may be used as a main gas instead of the $CHF_3$ gas used in the present embodiment.

The etching process is performed at a pressure in a range from about 5 mT to about 20 mT, for example about 12 mT. A source power for the ICP process may be in a range from about 500 W to about 700 W, for example about 600 W. A bias voltage for the IPC process may be in a range from about 120 V to about 240 V, for example about 200 V. It is also understood the bias voltage range of about 120 V to about 240 V is optimized, as a bias voltage lower than 120 V may lead to incomplete or ineffective etching, and a bias voltage greater than 240 V may lead to too much photoresist loss (i.e., the loss of the segments 93A and 93B). It is also understood that the etching process 160 is preferably performed using a continuous plasma process, since a pulsing type of etching process—which is discontinuous but commonly used in many etching processes—may lead to incomplete or ineffective etching as well.

As a result of the etching process 160, the middle layer 92 is patterned into segments 92A and 92B. The segments 92A and 92B align with the segments 93A and 93B, respectively, since the segments 93A and 93B serve as a mask during the etching process 160. In addition, a coating layer 180 is formed over the top surface and sidewall surfaces of the segments 93A-93B and 92A-92B. In some embodiments, the coating layer 180 includes a polymer material. The formation of the coating layer 180 is attributed at least in part to the addition of the $H_2$ gas. Due to various chemical reactions, the coating layer 180 is being continuously deposited on the segments 93A-93B and 92A-92B, while the etching continuously takes place as well. Stated differently, the etching of the middle layer 92 and the formation of the coating layer 180 occur substantially simultaneously and in a continuous manner. At the conclusion of the etching process 160, a collective height 185 of the segment 93A and the coating layer 180 is in a range from about 410 Angstroms to about 610 Angstroms.

As discussed above, the etching of the middle layer of a tri-layer photoresist according to conventional processes may not include, among other things, the inclusion of the $H_2$ gas as an etchant. As such, the conventional processes for etching the middle layer would not have resulted in a coating layer (or a layer similar to the coating layer 180) being continuously deposited on the photoresist mask (i.e., portions of the top layer similar to the segments 93A-93B). In other words, no protecting coating material would have been formed on the photoresist mask in conventional etching processes. The lack of protection for the photoresist mask often leads to over-etching of the photoresist mask, where the photoresist mask suffers greater-than-expected height loss. In some cases, portions of the photoresist mask may be etched away in its entirety. In either of these scenarios, the over-etched photoresist mask cannot be properly used to carry out etching of the middle layer, as that would likely result in broken line issues. For example, a segment of the middle layer that should not have been etched is now etched due to the insufficient photoresist mask. Consequently, semiconductor device performance may be degraded, and device failures may increase.

In comparison, the present disclosure continuously deposits the coating layer 180 around the segments 93A-93B of the top layer 93 (i.e., the photoresist mask). The coating layer 180 prevents the over-etching of the segments 93A-93B by protecting them while the middle layer 92 is being etched. As such, the etching process 160 of the present disclosure is unlikely to cause broken line issues that are commonly found for conventional etching processes.

Referring now to FIGS. 6A-6B, another etching process 190 is performed to "open" the bottom layer 91. In other words, the bottom layer 91 is patterned into segments 91A and 91B. The segments 92A and 92B of the patterned middle layer serve as a mask in this etching process 190. The etching process 190 may or may not be performed in the same etching chamber that was used to perform the de-scumming process 140 and the etching process 160 discussed above. The coating layer 180 may be removed during the etching process 190, or it may be removed before the etching process 190 is performed.

In certain embodiments, an etching gas of the etching process 190 includes HBr, $Cl_2$, $O_2$, and $N_2$. The HBr gas may have a flow rate in a range from about 40 sccm to about 60 sccm, for example about 50 sccm, the $Cl_2$ gas may have a flow rate in a range from about 5 sccm to about 40 sccm, for example about 20 sccm, the $O_2$ gas may have a flow rate in a range from about 40 sccm to about 150 sccm, for example about 90 sccm, and the $N_2$ gas may have a flow rate in a range from about 30 sccm to about 80 sccm, for example about 50 sccm.

Referring now to FIGS. 7A-7B, another etching process 200 is performed to pattern the amorphous silicon layer 70. In other words, the amorphous silicon layer 70 is patterned into segments 70A and 70B. The segments 91A and 91B of the patterned bottom layer serve as a mask in this etching process 200. The etching process 200 may or may not be performed in the same etching chamber that was used to perform the de-scumming process 140 and the etching processes 160 and 190 discussed above. The segments 92A-92B of the middle layer may be removed during the etching process 200, or it may be removed before the etching process 200 is performed.

Although not specifically illustrated or discussed for reasons of simplicity, one or more the various layers 40-65 may also be patterned using various etching processes. As a result of these etching processes, various semiconductor features such as trenches or islands may be formed. Again, due to the continuous formation of the coating layer 180 and the continuous etching of the middle layer 92 during the middle layer etching process, the various semiconductor features being patterned thereafter will be much less likely to suffer from inaccurate or inadequate patterning as a result of photoresist scum or broken line issues discussed above in association with conventional processes.

Figure 8:
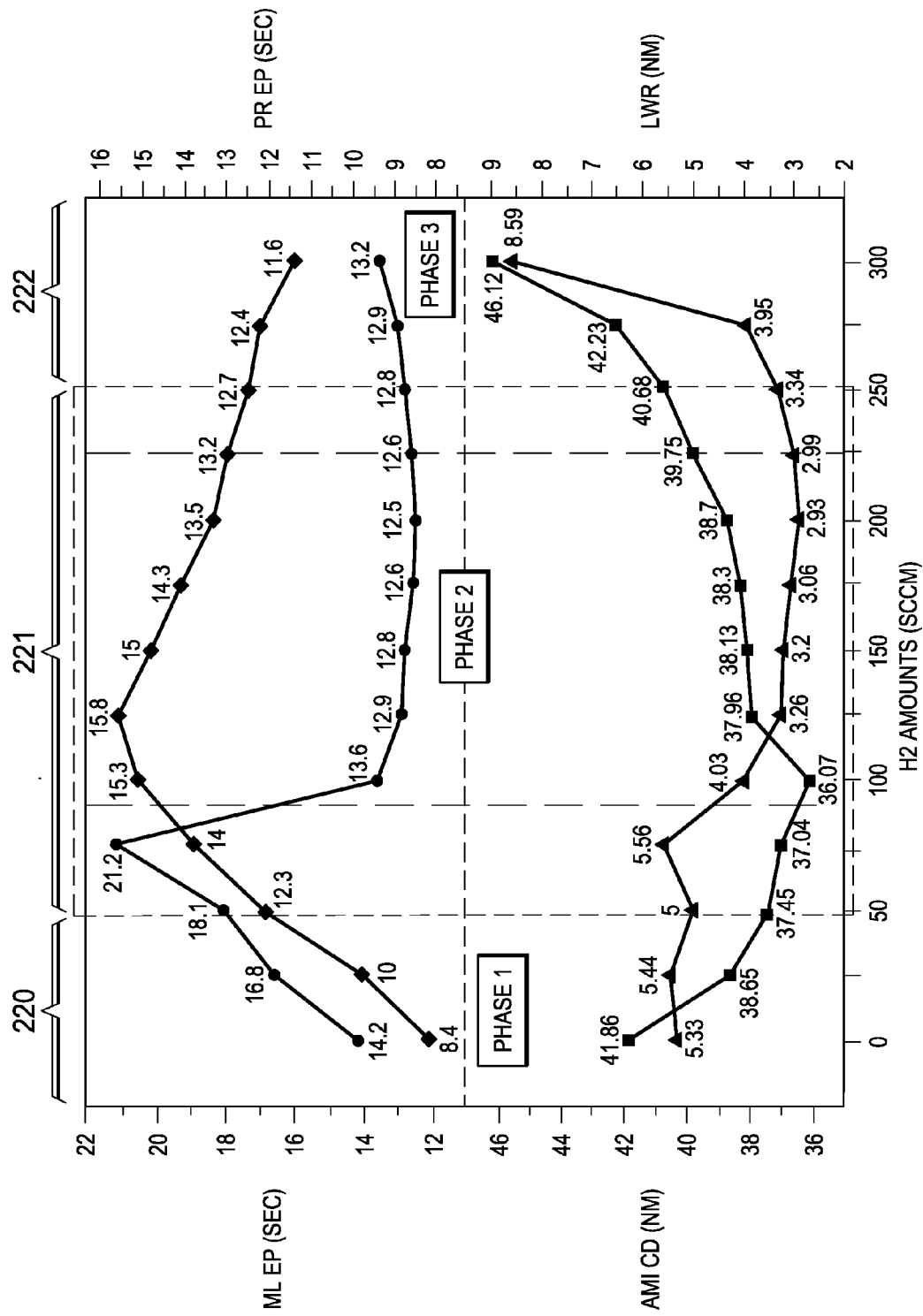
FIG. 8 is a graph graphical chart that illustrates three different phases that correspond to different flow rates of an $H_2$ gas in an etching process used to pattern the semiconductor device in accordance with aspects of the present disclosure.

FIG. 8 is a graphical chart that illustrates three different phases 220-222 that correspond to different flow rates of the $H_2$ gas in the etching process 160 shown in FIG. 5B. In FIG. 8, various etching performance parameters are plotted as the Y-axis with respect to different flow rates of the $H_2$ gas as the X-axis. For example, AMI CD denotes after-mask-inspection critical dimension, LWR denotes line width roughness, ML EP or BL EP denote middle layer endpoint or bottom layer end point, respectively (amount of etching time associated with the middle layer 92 or the bottom layer 91 as they are etched through), and PR EP denotes photoresist end point (amount of etching time associated with the complete removal of the top layer 93). In the etching process 160, there three mechanisms take place:

Mechanism A is directed to fluorine etching. Mechanism A includes the following chemical reactions: e−+$CF_4$=>$CF_3$+F+e−, and Si+4F=>$SiF_4$.

Mechanism B is directed to fluorine formation reduction and polymer formation. Mechanism B includes the following chemical reactions: H+F=>HF, and $CF_4$+$H_2$=>$C_xH_yF_z$.

Mechanism C is directed to fluorine formation. Mechanism C includes the following chemical reactions: HF+e−=>H+F+e−, and H+HF*=>$H_2$+F.

In phase 1, the mechanism B dominates. As a result, AMI CD decreases, LWR remains relatively constant, ML EP increases, and BL EP increases too. In phase 2, the mechanisms A, C, and C are relatively balanced. In other words, none of these mechanisms dominates. As a result, AMI CD is on target, LWR decreases, ML EP decreases or remains relatively constant, and BL EP decreases too. In phase 3, the mechanism C dominates. As a result, AMI CD increases, LWR increases, ML EP remains relatively constant, and BL EP decreases.

The behavior associated with the three phases 220-222 discussed above is also graphically illustrated in FIG. 8. It can be seen that an optimized and balanced performance is achieved in phase 2, where the $H_2$ gas is approximately in a range from about 50 sccm to about 250 sccm. In other words, phase 2 corresponds to a state where the etching of the middle layer and deposition of the protecting coating on the photoresist mask can occur continuously in a balanced manner. No over etching of the photoresist mask would occur, nor does etching take an excessively long time. Hence, the $H_2$ gas flow rate in phase 2 is considered optimized and is therefore implemented in the etching process 160 of the present disclosure.

One aspect of the present disclosure involves a method of fabricating a semiconductor device. The method includes: forming a material layer over a substrate; forming a tri-layer photoresist over the material layer, the tri-layer photoresist including a bottom layer, a middle layer disposed over the bottom layer, and a photo-sensitive layer disposed over the middle layer; performing a lithography process to pattern the photo-sensitive layer into a mask having one or more openings; removing undesired portions of the mask via a first etching process; and thereafter patterning the middle layer via a second etching process, wherein the second etching process includes forming a coating layer around the mask while the middle layer is being etched.

In some embodiments, the method further includes: patterning the bottom layer via a third etching process, wherein the mask and the coating layer are collectively removed during the third etching process; and using the patterned bottom layer to pattern the material layer.

In some embodiments, the undesired portions of the mask include photoresist scum that protrudes outward from the mask.

In some embodiments, the first etching process is performed using an Ar gas and a $CF_4$ gas; and the first etching process is performed at a pressure of about 2 milli-Torrs.

In some embodiments, the second etching process includes a plasma etching process, and wherein the plasma etching process is performed using at least a $C_xH_yF_z$ gas and an $H_2$ gas.

In some embodiments, the $H_2$ gas is configured to induce a polymer material to be deposited around the mask as the coating layer while the middle layer is being etched.

In some embodiments, a flow rate of the $H_2$ gas is in a range from about 50 standard cubic centimeters per minute (sccm) to about 250 sccm.

In some embodiments, the plasma etching process includes a continuous plasma process.

In some embodiments, the plasma etching process is performed at a bias voltage in a range from about 120 volts to about 240 volts.

In some embodiments, the bottom layer includes a first $C_xH_yO_z$ material; the middle layer includes a $SiC_xH_yO_z$ material; and the photo-sensitive layer includes a second $C_xH_yO_z$ material and a photo-acid generator.

Another aspect of the present disclosure involves a method of fabricating a semiconductor device. The method includes: forming a material layer over a substrate; forming a tri-layer photoresist over the material layer, the tri-layer photoresist including a first layer, a second layer disposed over the first layer, and a third layer disposed over the second layer, wherein the third layer contains a photo-sensitive material; forming a patterned third layer via a lithography process, the patterned third layer including one or more openings that expose the second layer therebelow; de-scumming the patterned third layer via a first etching process; after the de-scumming, forming a patterned second layer via a second etching process, wherein the second etching process includes continuously coating a polymer layer around the patterned third layer as the second layer is being etched; forming a patterned first layer via a third etching process, wherein the patterned second layer and the polymer layer coated thereon are collectively removed during the third etching process; and patterning the material layer using the patterned first layer.

In some embodiments, the first layer includes a first $C_xH_yO_z$ material; the second layer includes a $SiC_xH_yO_z$ material; and the third layer includes a second $C_xH_yO_z$ material and a photo-acid generator.

In some embodiments, the first etching process is performed using an Ar gas and a $CF_4$ gas; and the first etching process is performed at a pressure of about 2 milli-Torrs.

In some embodiments, the second etching process includes a plasma etching process that is pulsing-free, and wherein the plasma etching process is performed using at least a $C_xH_yF_z$ gas and an $H_2$ gas.

In some embodiments, a flow rate of the $H_2$ gas is ranging between about 50 standard cubic centimeters per minute (sccm) and about 250 sccm.

In some embodiments, the plasma etching process includes an Inductively Coupled Plasma (ICP) process.

In some embodiments, the plasma etching process is performed at a bias voltage ranging between about 120 volts and about 240 volts.

Yet another aspect of the present disclosure involves a method of fabricating a semiconductor device. The method includes: forming a material layer over a substrate; forming a tri-layer photoresist over the material layer, the tri-layer photoresist including a bottom layer, a middle layer disposed over the bottom layer, and a photo-sensitive top layer disposed over the middle layer, wherein the bottom layer includes a first $C_xH_yO_z$ material, the middle layer includes a $SiC_xH_yO_z$ material, and the photosensitive top layer includes a second $C_xH_yO_z$ material and a photo-sensitive element; performing a lithography process to pattern the photo-sensitive top layer into a mask having one or more openings, wherein the mask includes scum that extend laterally outward from the mask; de-scumming the mask by performing a first etching process, wherein the first etching process is performed using an Ar gas and a $CF_4$ gas; thereafter patterning the middle layer via a second etching process, wherein the second etching process includes continuously depositing a polymer coating layer around the de-scummed mask while the middle layer is being etched, and wherein the second etching process is performed using at least a $C_xH_yF_z$ gas and an $H_2$ gas; patterning the bottom layer via a third etching process, wherein the mask and the polymer coating layer are both removed during the third etching process; and patterning the material layer using the patterned bottom layer.

In some embodiments, the second etching process includes an Inductively Coupled Plasma (ICP) process with a bias voltage ranging between about 120 volts and about 240 volts.

In some embodiments, a flow rate of the $H_2$ gas of the second etching process is in a range from about 50 standard cubic centimeters per minute (sccm) to about 250 sccm.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   forming a first layer over a substrate;
   forming a second layer over the first layer;
   patterning the second layer into a mask having one or more openings that expose portions of the first layer; and
   etching the first layer through the one or more openings via a first etching process, resulting in a patterned first layer, wherein the first etching process includes forming a coating layer around both the mask and the patterned first layer while the first layer is being etched, and wherein the first etching process includes a plasma etching process performed using at least an $H_2$ gas.

2. The method of claim 1, wherein the $H_2$ gas is configured to induce a polymer material to be deposited around both the mask and the patterned first layer as the coating layer while the first layer is being etched.

3. The method of claim 1, wherein the plasma etching process is a continuous plasma process.

4. The method of claim 1, wherein the second layer includes a photo-sensitive material.

5. The method of claim 4, wherein the mask includes photoresist scum that protrudes outward from the mask, further comprising:
removing the photoresist scum via a second etching process before the etching of the first layer.

6. The method of claim 5, wherein the first and second etching processes are performed in a same etching chamber.

7. The method of claim 1, further comprising:
forming a third layer over the substrate before the forming of the first layer, wherein the first layer is formed over the third layer; and
etching the third layer using at least the patterned first layer as an etch mask.

8. The method of claim 7, further comprising:
removing the coating layer before the etching of the third layer.

9. The method of claim 7, wherein the etching of the third layer includes removing both the coating layer and the mask.

10. The method of claim 1, wherein a flow rate of the $H_2$ gas is in a range from 50 standard cubic centimeters per minute (sccm) to 250 sccm.

11. A method of fabricating a semiconductor device, comprising:
forming a first layer over a substrate;
forming a photo-sensitive layer over the first layer;
patterning the photo-sensitive layer into a mask having one or more openings; and
etching the first layer via a first etching process, resulting in a patterned first layer, wherein the first etching process includes forming a coating layer around both the mask and the patterned first layer while the first layer is being etched, and the first etching process includes a continuous plasma etching process that is performed using an etching gas that includes an $H_2$ gas.

12. The method of claim 11, wherein a flow rate of the $H_2$ gas is configured such that a polymer material is deposited around both the mask and the patterned first layer as the coating layer while the first layer is being etched.

13. The method of claim 11, wherein the etching gas further includes a $C_xH_yF_z$ gas.

14. The method of claim 11, wherein:
the first layer includes a $SiC_xH_yO_z$ material; and
the photo-sensitive layer includes a $C_xH_yO_z$ material.

15. The method of claim 11, wherein the mask includes photoresist scum that protrudes outward from the mask, further comprising:
removing the photoresist scum via a second etching process before the etching of the first layer.

16. The method of claim 15, wherein the second etching process includes another continuous plasma etching.

17. The method of claim 11, wherein a flow rate of the $H_2$ gas is in a range from 50 standard cubic centimeters per minute (sccm) to 250 sccm and the continuous plasma etching process is an Inductively Coupled Plasma (ICP) process with a bias voltage ranging between 120 volts and 240 volts.

18. A method of fabricating a semiconductor device, comprising:
forming a first layer over a substrate;
forming a second layer over the first layer;
forming a photo-sensitive layer over the second layer;
patterning the photo-sensitive layer into a mask having one or more openings;
etching the second layer through the one or more openings via a first etching process, resulting in a patterned second layer, wherein the first etching process includes forming a coating layer around both the mask and the patterned second layer while the second layer is being etched; and
etching the first layer using at least the patterned second layer as an etch mask.

19. The method of claim 18, wherein the first etching process includes a continuous plasma etching process that is performed using at least a $C_xH_yF_z$ gas and an $H_2$ gas.

20. The method of claim 18, wherein the mask and the coating layer are collectively removed during the etching of the first layer.

* * * * *